United States Patent
Kurapov et al.

(10) Patent No.: US 10,626,493 B2
(45) Date of Patent: Apr. 21, 2020

(54) METHOD FOR PRODUCING A DOUBLE-LAYER COATED CUTTING TOOL WITH IMPROVED WEAR RESISTANCE

(71) Applicants: Oerlikon Surface Solutions AG, Pfaffikon, Pfaffikon SZ (CH); Hitachi Metals, Ltd., Tokyo (JP); Mitsubishi Hitachi Tool Engineering, Ltd., Tokyo (JP)

(72) Inventors: Denis Kurapov, Walenstadt (CH); Tomoya Sasaki, Yasugi (JP); Shuho Koseki, Yasugi (JP); Kana Morishita, Yasugi (JP); Saleh Breik Abusuilik, Yasugi (JP); Kenichi Inoue, Narita (JP)

(73) Assignees: OERLIKON SURFACE SOLUTIONS AG, PFÄFFIKON, Pfäffikon SZ (CH); HITACHI METALS, LTD., Tokyo (JP); MITSUBISHI HITACHI TOOL ENGINEERING, LTD., Tokyo (JP)

( * ) Notice: Subject to any disclaimer, the term of this patent is extended or adjusted under 35 U.S.C. 154(b) by 0 days.

(21) Appl. No.: 15/511,675

(22) PCT Filed: Sep. 17, 2015

(86) PCT No.: PCT/EP2015/071318
§ 371 (c)(1),
(2) Date: Mar. 16, 2017

(87) PCT Pub. No.: WO2016/042072
PCT Pub. Date: Mar. 24, 2016

(65) Prior Publication Data
US 2017/0298497 A1   Oct. 19, 2017

Related U.S. Application Data
(60) Provisional application No. 62/051,456, filed on Sep. 17, 2014.

(51) Int. Cl.
C23C 14/06     (2006.01)
C23C 14/34     (2006.01)
C23C 14/35     (2006.01)

(52) U.S. Cl.
CPC ........ C23C 14/0641 (2013.01); C23C 14/345 (2013.01); C23C 14/3485 (2013.01); C23C 14/3492 (2013.01); C23C 14/352 (2013.01)

(58) Field of Classification Search
CPC .............. C23C 14/0641; C23C 14/345; C23C 14/3485; C23C 14/3492; C23C 14/352
See application file for complete search history.

(56) References Cited

U.S. PATENT DOCUMENTS

| | | | | |
|---|---|---|---|---|
| 3,625,848 A | * | 12/1971 | Snaper | C23C 14/325 204/192.11 |
| 5,160,595 A | * | 11/1992 | Hauzer | C23C 14/325 204/192.12 |
| 2010/0006426 A1 | * | 1/2010 | Sittinger | C03C 17/36 204/192.29 |
| 2010/0215912 A1 | * | 8/2010 | Kubota | C23C 14/0641 428/172 |

FOREIGN PATENT DOCUMENTS

| | | |
|---|---|---|
| CN | 103382548 A | 11/2013 |
| EP | 1 174 528 A2 | 1/2002 |
| JP | 2793773 B2 | 9/1998 |

OTHER PUBLICATIONS

International Search Report for PCT/EP2015/071318 dated Oct. 29, 2015.
Written Opinion for PCT/EP2015/071318 dated Oct. 29, 2015.
Chinchanikar, et al., "Hard Turning Using HiPIMS-coated carbide tools: Wear Behavior Under Dry and Minimum Quantity Lubrication (MQL)", Measurement, vol. 55, Jun. 19, 2014, pp. 536-548.
Chang, et al., "Characteristics and Performance of TiSin/TiAln Multilayers Coating Synthesized by Cathodic Arc Plasma Evaporation", Surface and Coatings Technology, Elsevier, Amsterdam, NL, vol. 202, No. 4-7, Nov. 13, 2007, pp. 987-992.
Nose, et al., "Influence of Sputtering Conditions on the Structure and Properties of Ti—S—N Thin Films Prepared by R. F.-Reactive Sputtering", Surface and Coatings Technology, vol. 174, No. 175, May 21, 2003, pp. 261-265.
Andre, "A Review Comparing Cathodic Arcs and High Power Impulse Magnetron Sputtering (HiPIMS)", Surface and Coatings Technology, vol. 357, Sep. 2, 2014, pp. 308-325.
Rafaja et al., "Capability of X-ray Diffraction for the Study of Microstructure of Metastable Thin Films", IUCrJ, pp. 446-456, 2014.
"Learn more about Nanocomposites", ScienceDirect, extracts from several articles, retrieved Sep. 2019.

* cited by examiner

*Primary Examiner* — John J Brayton
(74) *Attorney, Agent, or Firm* — Pearne & Gordon LLP

(57) ABSTRACT

A method for producing a tool coated with a hard coating, the method including the following steps: applying a TiAlN coating layer onto a substrate with a first magnetron sputtering process and applying a $Ti_xSi_{1-x}N$ coating layer onto the TiAlN layer with a second magnetron sputtering process, where x is smaller than or equal to 0.85 and preferably between and including 0.80 and 0.70 whereas the second magnetron sputtering process is performed with power densities greater than 100 W/cm$^2$ and as such is a HIPIMS process.

8 Claims, No Drawings

METHOD FOR PRODUCING A DOUBLE-LAYER COATED CUTTING TOOL WITH IMPROVED WEAR RESISTANCE

The present invention relates to a double layer-coated cutting tool with improved wear resistance used for cutting metallic materials.

PRIOR ART

There is an increasing need for a higher efficiency of cutting, in particular with respect to cutting speed and tool livetime. Earlier hard coating materials such as TiN and/or TiCN have been replaced by TiAlN in order to improve the wear resistance of for example endmills and inserts.

In order to further increase the efficiency of such coatings, Japanese Patent 2,793,773 proposes the addition of Si to TiAlN.

However a coating film simply containing Si is more brittle and due to increased compressive stress the coating film becomes prone to peel off from the cutting tool immediately after the coating film is formed.

This problem is described and addressed in EP 1174528 A2, which discloses that the Si-containing film is desirably used in combination with another hard coating film having excellent adhesion to the substrate. In addition the Si containing film is a composition-segregated polycrystalline film comprising a phase having relatively high Si concentration and a phase having relatively low Si concentration.

Although the solution as described in EP 1174528 A2 exhibits excellent results, up to now such phase segregation is unfortunately known to be realized by arc discharge ion-plating only. Droplets are a known problem with reactive arc discharge coating methods. They cause the coating layer to be relatively rough. This is of minor issue for normal size tools. However for small tools, such as endmills with diameter of two millimeter or less, the surface roughness might cause the tool to be damaged during use. Another disadvantage is that in layers produced with arc-discharge ion plating the Si content is lower as compared to the Si contend in the material delivering target. As it is quite difficult to produce stable targets with high Si content, the possible concentration of Si within a layer is below 15 at %.

There is therefore a need for a coating method which results in at least as good improvements as the phase segregated films of EP 1174528 A2 however which does not the encounter problems with droplets and therefore potentially results in smooth coating layers.

OBJECTIVE OF THE INVENTION

It is therefore an objective of the present invention to disclose a coating method which results in at least as good improvements as the phase segregated films of EP 1174528 A2 however which does not the encounter problems with droplets and therefore potentially results in smooth coating layers.

SOLUTION ACCORDING TO THE INVENTION

In order to well understand the solution according to the present invention it is helpful to roughly describe the principles magnetron sputtering.

During sputtering a target (cathode) is bombarded with ions, which results in material being removed from the target. The acceleration of the ions in the direction of the target surface from the plasma is achieved by means of an electric field. During magnetron sputtering, a magnetic field is formed over the target surface. In this manner electrons in the plasma are forced onto a spiral path and circulate over the target surface. Due to their increased path, the number of collisions of electrons with atoms is dramatically increased, which leads to a higher ionization in this area over the target surface. This results in increased sputtering removal on the target and therefore leads to an increased sputtering rate. Conventional sputtering is performed in a DC mode and at power densities typically at 20 W/cm2. The disadvantage of such conventional sputtering is that the material removed from the target is ionized only to a very low degree. This means that a negative bias applied to the substrates will not directly accelerate the sputtered material in direction to the substrates. Coating densities which can be reached with conventional sputtering are therefore considerably lower than coating densities which can be realized with arc discharge ion plating.

HIPIMS (High Impulse Power Magnetron Sputtering) is a process that evolved from conventional sputtering and that uses the effect of pulse-like discharges with impulse duration in the range of microseconds to milliseconds with power densities greater than 100 W/cm2. It has been shown that, depending on the material, HIPIMS technology could achieve a ionization of up to 100% of the sputtered particles, thus eliminating the great disadvantage of conventional sputtering.

The method according to the present invention relates to HIPIMS sputtering and comprises the following steps:
  applying a TiAlN coating layer onto a substrate with a first magnetron sputtering process
  applying a $Ti_xSi_{1-x}N$ coating layer onto the TiAlN layer with a second magnetron sputtering process, where x is smaller than or equal to 0.85 and preferably between and including 0.80 and 0.70,
characterized in that the second magnetron sputtering process is performed with power densities greater than 100 W/cm$^2$ and as such is a HIPIMS method.

Accordingly produced layers did not show any phase segregation. It was surprising that the tools, coated according to the method as described above showed comparable or sometimes even better performance as the same tools however coated with arc-discharge ion plating and resulting in the phase segregation as described in EP 1174528 A2.

A high number of double-layer coatings were coated with different coating parameters. For the sputtering of the TiAlN layer for example a target was chosen with a concentration Ti:Al at 40 at % to 60 at %.

Within the TiSiN layer, one important parameter, which was varied, was the Si content in the sputtering target for sputtering the TiSiN layer. Experiments showed that a high Si content in this layer is preferred. Coatings with a $Ti_xSi_{1-x}N$ layers with x=0.75 showed best results.

Another important parameter was the substrate bias during coating. Generally speaking whenever a HIPIMS process is performed a high bias applied during such process is of advantage. For the $Ti_xSi_{1-x}$ the bias however should be chosen considerably below weaker than −150V as for these bias values the tools showed considerable wear.

Therefore according to a preferred embodiment of the present invention, the second magnetron sputtering process is performed while applying a negative bias to the substrate with a value between and including −60V and −100V, in particular preferred with a value between and including −70V and −80V.

According to another preferred embodiment of the present invention, the first magnetron sputtering process is as well a HIPIMS process. In this case it is especially preferred if the first magnetron sputtering process is performed while applying a negative bias to the substrate with a value between and including −40V and −70V.

What is claimed is:

1. A method for producing a tool coated with a hard coating, the method comprising the following steps:
   applying a TiAlN coating layer onto a substrate with a first magnetron sputtering process
   applying a $Ti_xSi_{1-x}N$ coating layer onto the TiAlN layer with a second magnetron sputtering process, where x has a value between 0.70 and 0.80, inclusive, characterized in that the second magnetron sputtering process is a HIPIMS process performed with power densities greater than 100 W/cm$^2$, and wherein the coating layer of TiAlN and the coating layer of $Ti_xSi_{1-x}N$ have no phase segregation.

2. The method according to claim 1, characterized in that the second magnetron sputtering process is performed while applying a negative bias to the substrate with a value between and including −60V and −120V.

3. The method according to claim 1, characterized in that the first magnetron sputtering process is as well a HIPIMS process.

4. The method according to claim 3, characterized in that the first magnetron sputtering process is performed while applying a negative bias to the substrate with a value between and including −40V and −70V.

5. The method according to claim 2, wherein the negative bias has a value between and including −70V and −80V.

6. The method according to claim 1, wherein x has a value between 0.70 and 0.75, inclusive.

7. The method according to claim 1, wherein x has the value equal to 0.75.

8. The method according to claim 1, wherein the coating layer of TiAlN and the coating layer of $Ti_xSi_{1-x}N$ comprise a double-layer with the TiAlN coating layer as an underlayer and the $Ti_xSi_{1-x}N$ coating layer as an overlayer.

* * * * *